United States Patent
Bengoechea De La Llera et al.

(10) Patent No.: US 11,693,034 B2
(45) Date of Patent: Jul. 4, 2023

(54) OPTICAL FIBER WINDING FOR MEASURING THE CURRENT CIRCULATING THROUGH A CONDUCTOR, AND OPTICAL FIBER-BASED CURRENT MEASURING EQUIPMENT

(71) Applicant: LUMIKER APLICACIONES TECNOLOGICAS S.L., Derio (ES)

(72) Inventors: Francisco Javier Bengoechea De La Llera, Derio (ES); David Bengoechea Gonzalez, Derio (ES)

(73) Assignee: LUMIKER APLICACIONES TECNOLOGICAS S.L., Derio (ES)

( * ) Notice: Subject to any disclaimer, the term of this patent is extended or adjusted under 35 U.S.C. 154(b) by 0 days.

(21) Appl. No.: 17/868,102

(22) Filed: Jul. 19, 2022

(65) Prior Publication Data

US 2022/0365113 A1    Nov. 17, 2022

Related U.S. Application Data (63) Continuation of application No. 17/340,462, filed on Jun. 7, 2021, now Pat. No. 11,519,942.

(30) Foreign Application Priority Data

Jun. 15, 2020 (EP) .................................. 20382515

(51) Int. Cl.
  *G01R 15/24* (2006.01)
  *G01R 33/032* (2006.01)
(52) U.S. Cl.
  CPC ....... *G01R 15/246* (2013.01); *G01R 33/0322* (2013.01)

(58) Field of Classification Search
  CPC . G01R 15/246; G01R 33/0322; G01R 15/247
  (Continued)

(56) References Cited

U.S. PATENT DOCUMENTS

2018/0095113 A1* 4/2018 Bengoechea De La Llera ........... G01R 19/0092

FOREIGN PATENT DOCUMENTS

DE    3115433 A1   11/1982
EP    0108012 A1    5/1984
(Continued)

OTHER PUBLICATIONS

Extended European Search Report received in EP application No. 20382515.3, dated Dec. 2, 2020 (17 pages).

*Primary Examiner* — Christopher P McAndrew
(74) *Attorney, Agent, or Firm* — Edell, Shapiro & Finnan, LLC (57) ABSTRACT

An optical fiber winding for measuring current circulating through a conductor. The optical fiber winding includes a first helically wound optical fiber cable and a second helically wound optical fiber cable. The first helically wound optical fiber cable is twisted about its longitudinal axis in a first twist direction, and the second helically wound optical fiber cable is twisted about its longitudinal axis in a second twist direction, the first twist direction being opposite the second twist direction. Each of the first and second helically wound optical fiber cables making contact with one another at multiple locations along their length. Due to the first and second helically wound optical fiber cables making contact with one another and being twisted in opposite directions, counteracting forces exist where the first and second helically wound optical fiber cables contact one another to resist an untwisting.

21 Claims, 3 Drawing Sheets

(58) Field of Classification Search
USPC .................................................... 324/76.11
See application file for complete search history.

(56) References Cited

FOREIGN PATENT DOCUMENTS

| | | | | |
|---|---|---|---|---|
| GB | 2190744 A | * | 11/1987 | ........... G01R 15/246 |
| GB | 2190744 A | | 11/1987 | |
| JP | 2010266262 A | | 11/2010 | |

* cited by examiner

OPTICAL FIBER WINDING FOR MEASURING THE CURRENT CIRCULATING THROUGH A CONDUCTOR, AND OPTICAL FIBER-BASED CURRENT MEASURING EQUIPMENT

CROSS-REFERENCE TO RELATED APPLICATIONS

This application is a continuation of U.S. application Ser. No. 17/340,462, filed Jun. 7, 2021, which relates to and claims the benefit and priority to European Application No. EP20382515.3, filed Jun. 15, 2020.

TECHNICAL FIELD

The present invention relates to an optical fiber winding and optical fiber-based current measuring equipment for measuring the current circulating through a conductor.

BACKGROUND

Measuring equipment based on optical fiber for measuring the current circulating through a conductor is known. Said equipment operates according to the Faraday effect, i.e., the magnetic field generated by the current circulating through the conductor causes a rotation in the polarization of the light circulating through the optical fiber winding arranged around the conductor. The operation of said measuring equipment consists of emitting light through optical fiber to the optical fiber winding in which the characteristics of the light are modified depending on the current circulating through the conductor, and analyzing the rotation caused in the polarization of light so as to determine the magnitude of the current circulating through the conductor.

Theoretically speaking, the polarization of light of a perfectly circular single-mode optical fiber in which said light is propagated in a longitudinal propagation direction remains unchanged if it receives no external actions of any type. That is, theoretically speaking, the polarization of light at the inlet of the optical fiber would be identical to the polarization of light at the outlet of the optical fiber. Therefore, in the event of the action of a magnetic field generated by the current circulating through a conductor, the rotation in the polarization of light would only be due to the current circulating through the conductor.

However, in the real world, the polarization of light within an optical fiber presents a fairly random behavior which hinders measuring current. There are various factors that can be attributed to the optical fiber itself, causing the polarization of light in the longitudinal propagation direction to be changed. For example, the core of the optical fiber is not perfectly circular; when the optical fiber is arranged around the conductor mechanical stresses which are not homogeneous along its longitudinal extension are created; optical fiber is an element with an elastic behavior which can be twisted and bent. All of this causes changes in the polarization of light.

To correct these problems relative to the random behavior of the polarization of light within the optical fiber, special optical fiber sensors or specific measurement methods minimizing the impact generated by said randomness are known to be used.

EP3104183A1 or EP3598149A1, both belonging to the same applicant as the present invention, disclose optical fiber-based current measuring equipment for measuring the current circulating through a conductor, comprising an interrogator with light-emitting means and light-receiving means, a sensing portion close to the conductor, and an optical fiber transmission means arranged between the interrogator and the sensing portion.

SUMMARY

Disclosed is an optical fiber winding and optical fiber-based current measuring equipment for measuring the current circulating through a conductor.

A first aspect of the invention relates to an optical fiber winding for measuring the current circulating through a conductor, comprising:
  a central support core extending in a longitudinal direction,
  a first optical fiber cable arranged around the central support core, and
  a second optical fiber cable arranged around the central support core.

The optical fiber cables extend in a helical manner around the central support core, the first optical fiber cable is twisted about its longitudinal axis in a first twist direction, and the second optical fiber cable is twisted about its longitudinal axis in a second twist direction, the first twist direction being opposite the second twist direction.

A second aspect of the invention relates to optical fiber-based current measuring equipment for measuring the current circulating through a conductor, comprising:
  an interrogator with light-emitting means and light-receiving means,
  a sensing portion close to the conductor, and
  an optical fiber transmission means arranged between the interrogator and the sensing portion, wherein the sensing portion comprises an optical fiber winding comprising:
    a central support core extending in a longitudinal direction,
    a first optical fiber cable arranged around the central support core, and
    a second optical fiber cable arranged around the central support core.

The optical fiber cables extend in a helical manner around the central support core, the first optical fiber cable is twisted about its longitudinal axis in a first twist direction, and the second optical fiber cable is twisted about its longitudinal axis in a second twist direction, the first twist direction being opposite the second twist direction.

The twisting of the optical fiber allows single-mode optical fiber cables to be used for measuring the current circulating through the conductor. The twisting of the optical fiber is one of the factors changing the polarity of the light circulating through the optical fiber, such that by applying twisting on the longitudinal axis of the fiber, the remaining factors changing the polarity of light can be considered negligible with respect to the twisting factor. Therefore, by introducing controlled twisting in the optical fiber allows for the changes in the polarization of light basically being due to the magnetic field caused by the current circulating through the conductor, where the other factors can be considered irrelevant for the measurement of the current.

However, optical fiber is an elastic element which tends to recover its original shape when twisting is no longer applied. According to the invention, the two optical fiber cables twisted in opposite directions and arranged around the central support core allow obtaining a stable mechanical assembly which can be readily wound around the conductor the current of which is to be measured. The natural tendency of optical fiber cables is to return to their natural position, but since the cables are twisted in opposite directions, they will make efforts to recover their shape which will be counteracted.

A winding which is free of mechanical stresses and can be used as an optical fiber assembly for measuring the current of a conductor is thereby obtained. By means of a winding or wire drawing machine, the optical fiber winding can be arranged around the conductor, with the optical fibers of the winding remaining twisted around the central support core, without loops or bends arising which hinder the placement of the winding on the conductor.

These and other advantages and features will become apparent in view of the figures and detailed description.

DETAILED DESCRIPTION

The invention relates to an optical fiber winding 100 arranged around a conductor 5 for measuring the current I circulating through the conductor 5. The optical fiber winding 100 operates according to the Faraday effect. The magnetic field generated by the current I circulating through the conductor 5 causes a rotation in the polarization of the light circulating through the optical fiber winding 100 arranged around the conductor 5.

As shown in the embodiments of FIGS. 1 to 4, the optical fiber winding 100 comprises a central support core 110 extending in a longitudinal direction Z, a first optical fiber cable 120 arranged around the central support core 110, and a second optical fiber cable 130 arranged around the central support core 110.

The optical fiber cables 120 and 130 extend in a helical manner around the central support core 110 in the longitudinal direction Z. The first optical fiber cable 120 is twisted about its longitudinal axis Z1 in a first twist direction T1, and the second optical fiber cable 130 is twisted about its longitudinal axis Z2 in a second twist direction T2, the first twist direction T1 being opposite the second twist direction T2.

Twisting is understood as the optical fiber cables 120 and 130 being rotated about their longitudinal axes a certain number of turns.

The material with which the optical fiber cables are made has an elastic behavior, such that when a force is applied on the cable, the shape of the cable is modified, but when is removed said force, the elastic behavior of the cable tends to return it to its natural position. The configuration of the optical fiber winding 100 of the invention solves that problem. The central support core 110 keeps the optical fiber cables 120 and 130 extended in the longitudinal direction Z, impeding the natural tendency of the fiber to go back to its natural position. Furthermore, since the cables 120 and 130 are twisted in opposite directions, they make efforts to recover their shape that are counteracted. All this allows a mechanical stability of the optical fiber winding 100 without the need to apply external forces to maintain said stability.

For example, to maintain the twisting of the optical fiber cables 120 and 130, a force can be applied at each end of the cable and in the opposite direction, i.e., the optical fiber cables 120 and 130 can be longitudinally stressed from their ends to keep them twisted. However, applying that longitudinal tension causes the optical fiber cable to acquire an elliptical instead of circular shape, i.e., linear birefringence increases, which causes the measurement capacity to be reduced. The previously described arrangement of the winding 100 allows maintaining the twisting of the cables 120 and 130 without having to apply longitudinal tension in the cables.

Figure 5:
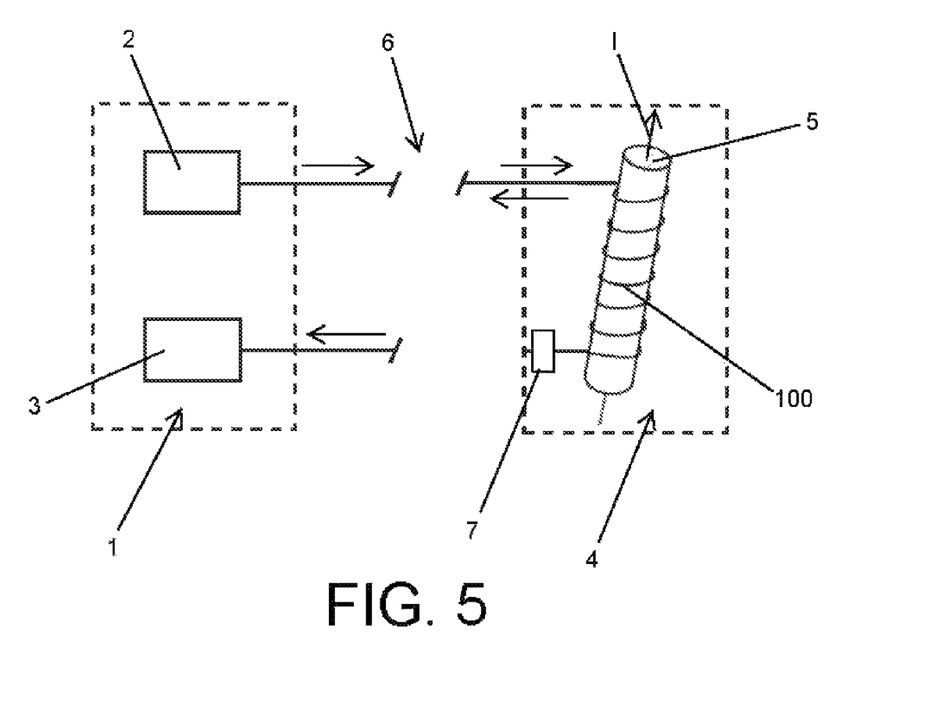
FIG. 5 shows optical fiber-based current measuring equipment for measuring the current circulating through a conductor.

FIG. 5 shows an example of optical fiber-based current measuring equipment for measuring the current circulating through a conductor 5. The equipment comprises an interrogator 1 with light-emitting means 2 and light-receiving means 3, a sensing portion 4 close to the conductor 5, and optical fiber transmission means 6 arranged between the interrogator 1 and the sensing portion 4. The sensing portion 4 comprises an optical fiber winding 100 such as the one previously described, which is arranged around the conductor 5 for measuring the current I circulating through the conductor 5.

The operation of the measuring equipment consists of emitting light through the optical fiber transmission means 6 to the optical fiber winding 100 in which the features of the light are modified depending on the current I circulating through the conductor 5, and analyzing the rotation caused in the polarization of the light so as to determine the magnitude of the current I circulating through the conductor 5.

Pulses of light are sent from the light-emitting means 2 of the interrogator 1 to the optical fiber winding 100 of the sensing portion 4 through the optical fiber transmission means 6. The pulses are reflected in reflection means 7, such as a Faraday mirror, or a normal mirror, and return through the optical fiber winding 100, being directed towards the light-receiving means 3 of the interrogator 1 through the optical fiber transmission means 6.

The interrogator 1 is located away from the sensing portion 4 for measuring the current I remotely, and the optical fiber transmission means 6 allow connecting the interrogator 1 with the sensing portion 4 at large distances.

FIG. 5 illustrates the optical fiber winding 100 arranged in a helical manner around the conductor 5. Alternatively, the optical fiber winding 100 can be arranged on an optical fiber reel. The winding 100 is therefore not arranged in a helical manner on the conductor 5, but rather the winding 100 is wound up a certain number of turns forming a loop inside the reel, and the conductor 5 is passed through the center of said reel. In that configuration, the reel is arranged transversely with respect to the longitudinal direction in which the conductor extends.

Figure 1:
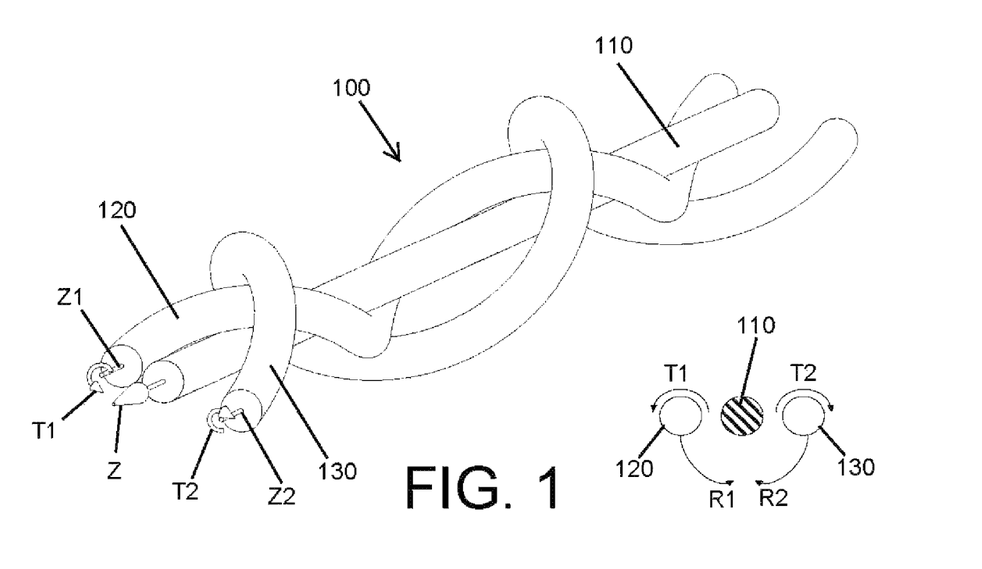
FIG. 1 shows a first embodiment of an optical fiber winding for measuring the current circulating through a conductor.
Figure 2:
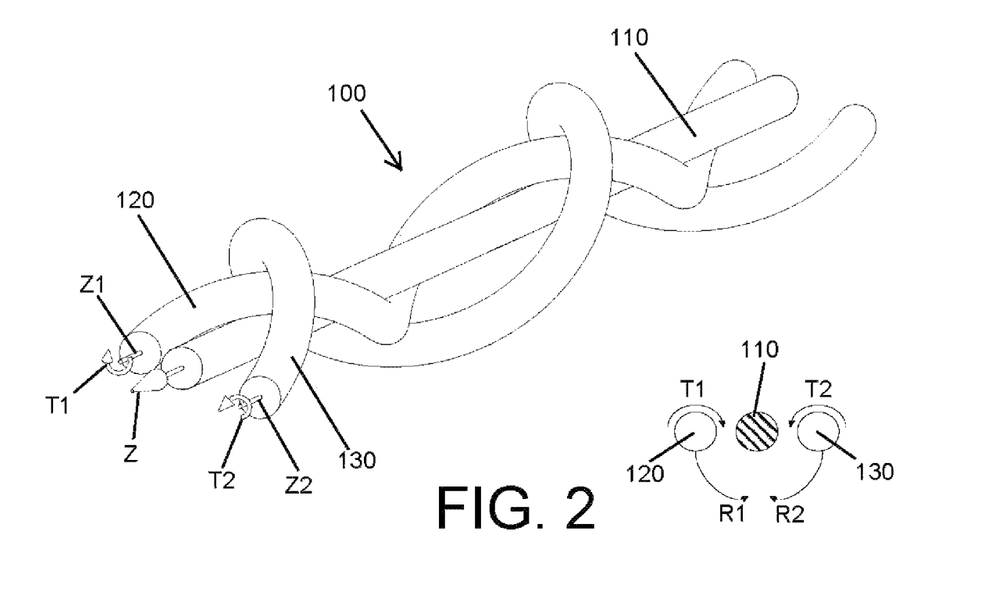
FIG. 2 shows a second embodiment of an optical fiber winding for measuring the current circulating through a conductor.

FIGS. 1 and 2 show first and second embodiments of the optical fiber winding 100.

The first optical fiber cable 120 extends in a helical manner around the central support core 110 according to a first rotation direction R1, and the second optical fiber cable 130 extends in a helical manner around the central support core 110 according to a second rotation direction R2, the first rotation direction R1 being opposite the second rotation direction R2, such that the optical fiber cables 120,130 are interlaced with one another around the central support core 110. Therefore, every time the cables 120 and 130 are interlaced, a contact area is created between both which favors the cables maintaining the twisting and their stability on the core central 110.

In the first embodiment of FIG. 1, the first twist direction T1 of the first cable 120 is counterclockwise, the first rotation direction R1 of the first cable 120 is counterclockwise, the second twist direction T2 of the second cable 130 is clockwise, and the second rotation direction R2 of the second cable 130 is clockwise.

In the second embodiment of FIG. 2, the first twist direction T1 of the first cable 120 is clockwise, the first rotation direction R1 of the first cable 120 is counterclockwise, the second twist direction T2 of the second cable 130 is counterclockwise, and the second rotation direction R2 of the second cable 130 is clockwise.

Figure 3:
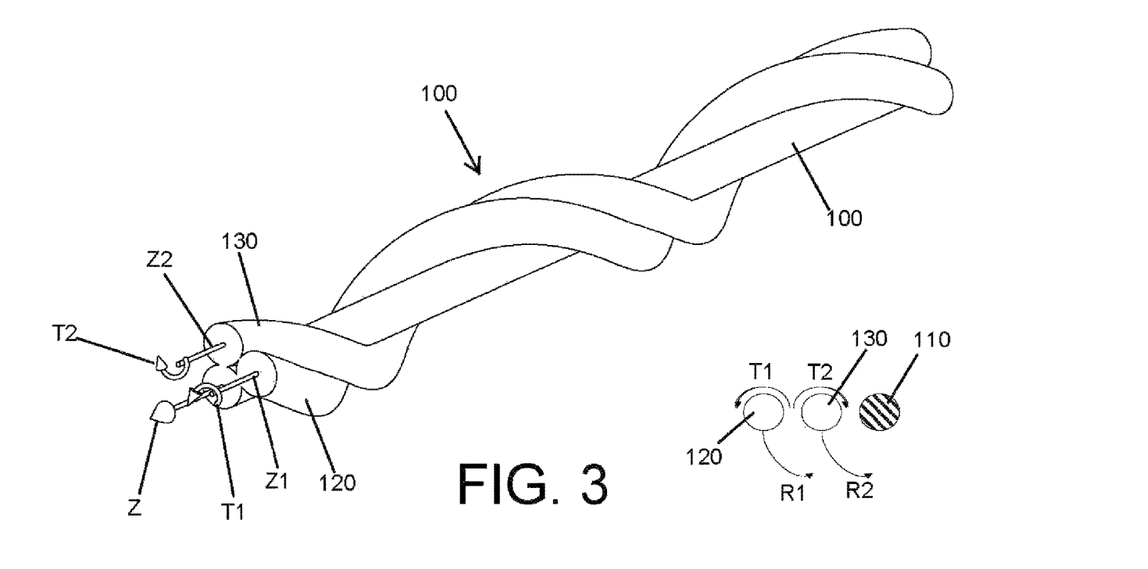
FIG. 3 shows a third embodiment of an optical fiber winding for measuring the current circulating through a conductor.
Figure 4:
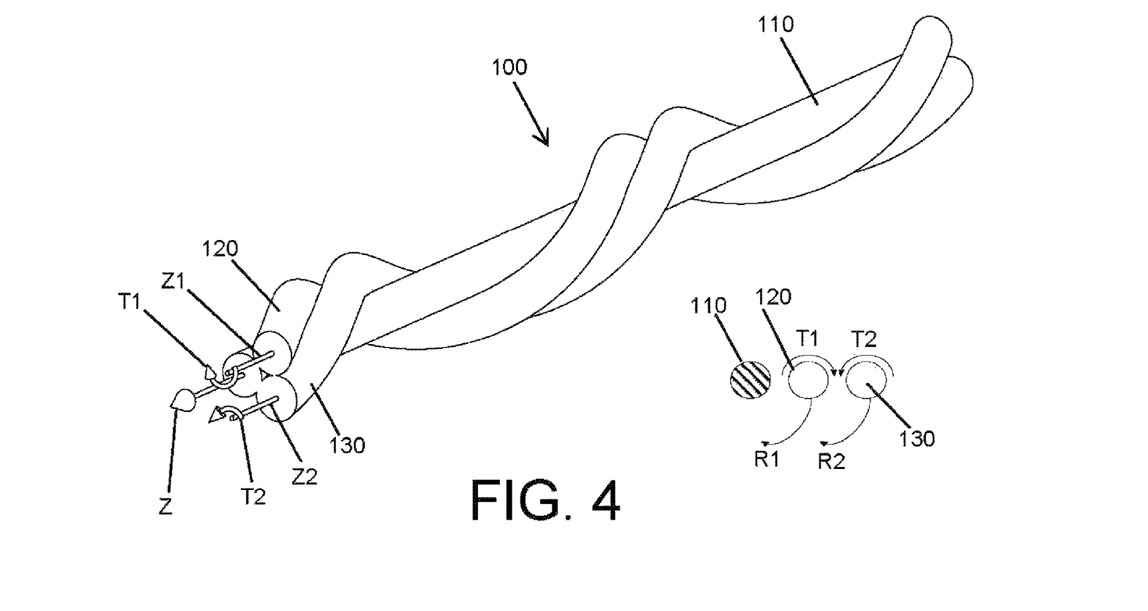
FIG. 4 shows a fourth embodiment of an optical fiber winding for measuring the current circulating through a conductor.

FIGS. 3 and 4 show third and fourth embodiments of the optical fiber winding 100. The first optical fiber cable 120 extends in a helical manner around the central support core 110 according to a first rotation direction R1, and the second optical fiber cable 130 extends in a helical manner around the central support core 110 according to a second rotation direction R2, the first rotation direction R1 being the same as the second rotation direction R2, and the optical fiber cables 120 and 130 being in contact with one another along their entire longitudinal extension around the central support core 110. Unlike the embodiments of FIGS. 1 and 2, in this case the cables 120 and 130 are not interlaced with one another, such that retaining points between them are not created; however, the cables 120 and 130 are at all times in contact with the central support core 110 and with one another.

In the third embodiment of FIG. 3, the first twist direction T1 of the first cable 120 is counterclockwise, the second twist direction T2 of the second cable 130 is clockwise, and the first rotation direction R1 of the first cable 120 and the second rotation direction R2 of the second cable 130 are counterclockwise.

In the fourth embodiment of FIG. 4, the first twist direction T1 of the first cable 120 is clockwise, the second twist direction T2 of the second cable 130 is counterclockwise, and the first rotation direction R1 of the first cable 120 and the second rotation direction R2 of the second cable 130 are clockwise.

Preferably, the first optical fiber cable 120 is twisted about its longitudinal axis Z1 a first number of turns, and the second optical fiber cable 130 is twisted about its longitudinal axis Z2 a second number of turns, the first and the second number of turns being the same. The twisting of both cables is therefore the same, and the behavior of the polarization of light in both cables is therefore similar. This feature allows applying methods for measuring current in which it is necessary for both cables to emit optical signals in order to carry out the measurement.

Preferably, the optical fiber cables 120 and 130 are twisted $$12 \times 2\pi \frac{rad}{m},$$

i.e., the cables are twisted 12 certain turns for each meter of cable.

The central support core 110 can be a mechanical element, such as a metal or plastic cable. Alternatively, the central support core 110 is made up of one or more optical fiber cables. This arrangement allows emitting an additional number of optical signals which can be used for applying different methods for measuring the current I circulating through the conductor 5.

The optical fiber cables 120 and 130 are standard single-mode optical fiber cables of the type normally used in the telecommunication sector. The twisting of the optical fiber cables 120 and 130 allows being able to use single-mode optical fiber cables to perform the measurement of the current of the conductor 5. Therefore, by using standard optical fiber cables a low-cost optical fiber winding 100 is obtained to perform current measurements, which is particularly relevant when the current in long cables for carrying electrical energy is to be measured. For example, the optical fiber winding 100 may be 100 meters long.

A single-mode optical fiber cable generally comprises a core, a cladding surrounding the core, a buffer surrounding the cladding, and a jacket surrounding the buffer. The core is the physical component that carries light and is generally made of glass fiber, the cladding protects the core and allows the propagation of the light. The buffer and the jacket are elements generally made of rigid plastic which provide protection and stiffness to the optical fiber cable.

As explained above, the polarization of light within an optical fiber presents a fairly random behavior which hinders measuring current. If an optical fiber is analyzed, from the point of view of propagation thereof, for purposes of polarization, and without contemplating the presence of magnetic fields due to the action exerted by an electrical conductor, the following behavior matrix is obtained:

$$\begin{bmatrix} E_{xo} \\ E_{yo} \end{bmatrix} = \begin{bmatrix} \cos(\sigma l) + j\frac{\delta_l}{2\sigma}\sin(\sigma l) & \frac{\left(\psi + \frac{\delta_c}{2}\right)}{\sigma}\sin(\sigma l) \\ -\frac{\left(\psi + \frac{\delta_c}{2}\right)}{\sigma}\sin(\sigma l) & \cos(\sigma l) - j\frac{\delta_l}{2\sigma}\sin(\sigma l) \end{bmatrix} \begin{bmatrix} E_{xi} \\ E_{yi} \end{bmatrix}$$

wherein:

$$\begin{bmatrix} E_{xo} \\ E_{yo} \end{bmatrix}$$

is the electric field at the outlet of the optical fiber.

$$\begin{bmatrix} E_{xi} \\ E_{yi} \end{bmatrix}$$

is the electric item et me inlet of the optical fiber.
$\delta_l$ is the linear birefringence of the optical fiber in rad/m.
$\delta_c$ is the circular birefringence of the optical fiber in rad/m.
$\psi$ is the twisting of the optical fiber in rad/m.
l is the length of the optical fiber in m.

$$\sigma = \sqrt{\left(\frac{\delta_l}{2}\right)^2 + \left(\psi + \frac{\delta_c}{2}\right)^2}$$

In the presence of a magnetic field due to the action exerted by an electrical conductor, the behavior matrix would be:

$$\begin{bmatrix} E_{xo} \\ E_{yo} \end{bmatrix} = \begin{bmatrix} \cos(\sigma l) + j\frac{\delta_l}{2\sigma}\sin(\sigma l) & \frac{\left(\psi + \phi + \frac{\delta_c}{2}\right)}{\sigma}\sin(\sigma l) \\ -\frac{\left(\psi + \phi + \frac{\delta_c}{2}\right)}{\sigma}\sin(\sigma l) & \cos(\sigma l) - j\frac{\delta_l}{2\sigma}\sin(\sigma l) \end{bmatrix} \begin{bmatrix} E_{xi} \\ E_{yi} \end{bmatrix}$$

wherein $\phi$=VBl $\phi$ is the angle of rotation of the polarization of light in radians.

V is the Verdet constant of the optical fiber.

B is the density of the magnetic field.

l is the length of the optical fiber in m.

In the behavior matrix of an optical fiber with respect to polarization, it can be observed that if sufficient twisting is applied to the fiber, that term twisting $\psi$ becomes dominant, such that the polarization matrix is simplified:

$$\begin{bmatrix} E_{xo} \\ E_{yo} \end{bmatrix} = \begin{bmatrix} \cos(\sigma l) & \sin(\sigma l) \\ -\sin(\sigma l) & \cos(\sigma l) \end{bmatrix} \begin{bmatrix} E_{xi} \\ E_{yi} \end{bmatrix}$$

The change in circular birefringence providing twisting to the fiber, which is about −0.075 of the amount of twisting performed, is disregarded.

In the presence of a magnetic field, the following holds:

$\sigma \approx (\psi + \phi)$

Given that the twisting may be unstable once certain levels of magnitude are reached, the light is required to pass through the turns of the winding 100, to be reflected in the mirror 7 and to go back through said turns of the winding 100, such that the effect of mechanical twisting is cancelled out, and given that the effect of the magnetic field is not symmetrical, the magnetic field measurement is doubled.

In this manner and by placing the mirror 7 at the end final of the optical fiber winding 100 (for example, a Faraday mirror, or a normal mirror, or another reflective element), the polarization matrix would be: This is the polarization matrix using a Faraday mirror:

$$\begin{bmatrix} E_{xo} \\ E_{yo} \end{bmatrix} = \begin{bmatrix} -\sin(2\phi) & \cos(2\phi) \\ \cos(2\phi) & \sin(2\phi) \end{bmatrix} \begin{bmatrix} E_{xi} \\ E_{yi} \end{bmatrix}$$

It can therefore be observed that with the fiber twisted, the change polarization, is due only to the presence of the magnetic field.

According to the foregoing, on one hand, the invention proposes twisting the optical fiber cables 120 and 130 to preferably be able to use standard single-mode optical fiber cables for measuring current. On the other hand, the manner in which the optical fiber winding 100 is performed allows maintaining the twisting of the optical fiber cables 120 and 130 without the need to use external forces or elements.

Embodiments of optical fiber windings and optical fiber-based current measuring equipment are also disclosed in the following clauses.

Clause 1. Optical fiber winding for measuring the current circulating through a conductor, comprising:
 a central support core (110) extending in a longitudinal direction (Z),
 a first optical fiber cable (120) arranged around the central support core (110), and
 a second optical fiber cable (130) arranged around the central support core (110), wherein the optical fiber cables (120, 130) extend in a helical manner around the central support core (110), the first optical fiber cable (120) is twisted about its longitudinal axis (Z1) in a first twist direction (T1), and the second optical fiber cable (130) is twisted about its longitudinal axis (Z2) in a second twist direction (T2), the first twist direction (T1) being opposite the second twist direction (T2).

Clause 2. Winding according to clause 1, wherein the first optical fiber cable (120) extends in a helical manner around the central support core (110) according to a first rotation direction (R1), and the second optical fiber cable (130) extends in a helical manner around the central support core (110) according to a second rotation direction (R2), the first rotation direction (R1) being opposite the second rotation direction (R2), such that the optical fiber cables (120,130) are interlaced with one another around the central support core (110).

Clause 3. Winding according to clause 2, wherein the first twist direction (T1) of the first cable (120) is counterclockwise, the first rotation direction (R1) of the first cable (120) is counterclockwise, the second twist direction (T2) of the second cable (130) is clockwise, and the second rotation direction (R2) of the second cable (130) is clockwise.

Clause 4. Winding according to clause 2, wherein the first twist direction (T1) of the first cable (120) is clockwise, the first rotation direction (R1) of the first cable (120) is counterclockwise, the second twist direction (T2) of the second cable (130) is counterclockwise, and the second rotation direction (R2) of the second cable (130) is clockwise.

Clause 5. Winding according to clause 1, wherein the first optical fiber cable (120) extends in a helical manner around the central support core (110) according to a first rotation direction (R1), and the second optical fiber cable (130) extends in a helical manner around the central support core (110) according to a second rotation direction (R2), the first rotation direction (R1) being the same as the second rotation direction (R2), and the optical fiber cables (120,130) being in contact with one another along their entire longitudinal extension around the central support core (110).

Clause 6. Winding according to clause 5, wherein the first twist direction (T1) of the first cable (120) is counterclockwise, the second twist direction (T2) of the second cable (120) is clockwise, and the first rotation direction (R1) of the first cable (130) and the second rotation direction (R2) of the second cable (130) are counterclockwise.

Clause 7. Winding according to clause 5, wherein the first twist direction (T1) of the first cable (120) is clockwise, the second twist direction (T2) of the second cable (130) is counterclockwise, and the first rotation direction (R1) of the first cable (120) and the second rotation direction (R2) of the second cable (130) are clockwise.

Clause 8. Winding according to any of the preceding clauses, wherein the first optical fiber cable (120) is twisted about its longitudinal axis (Z1) a first number of turns, and the second optical fiber cable (130) is twisted about its longitudinal axis (Z2) a second number of turns, the first and second number of turns being the same.

Clause 9. Winding according to the preceding clause, wherein the optical fiber cables (120,130) are twisted $$12 \times 2\pi \frac{\text{rad}}{\text{m}}.$$

Clause 10. Winding according to any of the preceding clauses, wherein the central support core (110) is made up of one or more optical fiber cables.

Clause 11. Optical fiber-based current measuring equipment for measuring the current circulating through a conductor, comprising:
- an interrogator (1) with light-emitting means (2) and light-receiving means (3),
- a sensing portion (4) close to the conductor (5), and
- an optical fiber transmission means (6) arranged between the interrogator (1) and the sensing portion (4),
- the sensing portion (4) comprises an optical fiber winding (100) comprising:
  - a central support core (110) extending in a longitudinal direction (Z),
  - a first optical fiber cable (120) arranged around the central support core (110), and
  - a second optical fiber cable (130) arranged around the central support core (110),
  - wherein the optical fiber cables (120, 130) extend in a helical manner around the central support core (110), the first optical fiber cable (120) is twisted about its longitudinal axis (Z1) in a first twist direction (T1), and the second optical fiber cable (130) is twisted about its longitudinal axis (Z2) in a second twist direction (T2), the first twist direction (T1) being opposite the second twist direction (T2).

Clause 12. Equipment according to clause 11, wherein the first optical fiber cable (120) extends around the central support core (110) according to a first rotation direction (R1), and the second optical fiber cable (130) extends in a helical manner around the central support core (110) according to a second rotation direction (R2), the first rotation direction (R1) being opposite the second rotation direction (R2), such that the optical fiber cables (120,130) are interlaced with one another around the central support core (110).

Clause 13. Equipment according to clause 11, wherein the first optical fiber cable (120) extends around the central support core (110) according to a first rotation direction (R1), and the second optical fiber cable (130) extends in a helical manner around the central support core (110) according to a second rotation direction (R2), the first rotation direction (R1) being the same as the second rotation direction (R2), and the optical fiber cables (120,130) being in contact with one another along their entire longitudinal extension around the of the central support core (110).

Clause 14. Equipment according to any of clauses 11 to 13, wherein the first optical fiber cable (120) is twisted about its longitudinal axis (Z1) a first number of turns, and the second optical fiber cable (130) is twisted about its longitudinal axis (Z2) a second number of turns, the first and second number of turns being the same.

Clause 15. Equipment according to the preceding clause, wherein the optical fiber cables (120,130) are twisted $$12 \times 2\pi \frac{\text{rad}}{\text{m}}.$$

What is claimed is:

1. An optical fiber winding for measuring the current circulating through a conductor, the optical fiber winding comprising:
   - a first helically wound standard single-mode optical fiber cable having a length and a first central axis, the first helically wound standard single-mode fiber cable being twisted about the first central axis in a first twist direction; and
   - a second helically wound standard single-mode optical fiber cable having a length and a second central axis, the second helically wound standard single-mode optical fiber cable being twisted about the second central axis in a second twist direction, the second twist direction being opposite the first twist direction,
   - each of the first and second helically wound standard single-mode optical fiber cables making contact with one another at multiple locations along their length, due to the first and second helically wound standard single-mode optical fiber cables making contact with one another and being twisted in opposite directions, counteracting forces exist where the first and second helically wound standard single-mode optical fiber cables contact one another to resist an untwisting of the first and second helically wound standard single-mode optical fiber cables.

2. The optic fiber winding according to claim 1, further comprising a central support core, each of the first and second helically wound standard single-mode optical fiber cables being arranged around the central support core.

3. The optical fiber winding according to claim 2, wherein the first helically wound standard single-mode optical fiber cable extends in a helical manner around the central support core according to a first rotation direction, and the second helically wound standard single-mode optical fiber cable extends in a helical manner around the central support core according to a second rotation direction, the first rotation direction being opposite the second rotation direction, such that the first and second helically wound standard single-mode optical fiber cables are interlaced with one another around the central support core.

4. The optical fiber winding according to claim 3, wherein the first twist direction of the first helically wound standard single-mode optical fiber cable is counterclockwise, the first rotation direction of the first helically wound standard single-mode optical fiber cable is counterclockwise, the second twist direction of the second helically wound standard single-mode optical fiber cable is clockwise, and the second rotation direction of the second helically wound standard single-mode optical fiber cable is clockwise.

5. The optical fiber winding according to claim 3, wherein the first twist direction of the first helically wound standard single-mode optical fiber cable is clockwise, the first rotation direction of the first helically wound standard single-mode optical fiber cable is counterclockwise, the second twist direction of the second helically wound standard single-mode optical fiber cable is counterclockwise, and the second rotation direction of the second helically wound standard single-mode optical fiber cable is clockwise.

6. The optical fiber winding according to claim 2, wherein the first helically wound standard single-mode optical fiber cable extends in a helical manner around the central support core according to a first rotation direction, and the second helically wound standard single-mode optical fiber cable extends in a helical manner around the central support core according to a second rotation direction, the first rotation direction being the same as the second rotation direction, and the first and second helically wound standard single-mode optical fiber cables being in contact with one another along their entire longitudinal extension around the central support core.

7. The optical fiber winding according to claim 6, wherein the first twist direction of the first helically wound standard single-mode optical fiber cable is counterclockwise, the second twist direction of the second helically wound standard single-mode optical fiber cable is clockwise, and the first rotation direction of the first helically wound standard single-mode optical fiber cable and the second rotation direction of the second helically wound standard single-mode optical fiber cable are counterclockwise.

8. The optical fiber winding according to claim 6, wherein the first twist direction of the first helically wound standard single-mode optical fiber cable is clockwise, the second twist direction of the second helically wound standard single-mode optical fiber cable is counterclockwise, and the first rotation direction of the first helically wound standard single-mode optical fiber cable and the second rotation direction of the second helically wound standard single-mode optical fiber cable are clockwise.

9. The optical fiber winding according to claim 1, wherein the first helically wound standard single-mode optical fiber cable is twisted about the first central axis in the first twist direction a first number of turns, and the second helically wound standard single-mode optical fiber cable is twisted about the second central axis in the second twist direction a second number of turns, the first and second number of turns being the same.

10. The optical fiber winding according to claim 9, wherein each of the first and second helically wound standard single-mode optical fiber cables is twisted $$12 \times 2\pi \frac{\text{rad}}{\text{m}}.$$

11. The optical fiber winding according to claim 2, wherein the central support core is made up of one or more optical fiber cables.

12. An optical fiber-based current measuring assembly for measuring the current circulating through a conductor, the assembly comprising:
  an interrogator including a light emitter and a light receiver;
  a sensing portion close to the conductor; and
  an optical fiber transmission means arranged between the interrogator and the sensing portion,
  the sensing portion including an optical fiber winding comprising:
    a first helically wound standard single-mode optical fiber cable having a length and a first central axis, the first helically wounds standard single-mode fiber cable being twisted about the first central axis in a first twist direction; and
    a second helically wound standard single-mode optical fiber cable having a length and a second central axis, the second helically wound standard single-mode optical fiber cable being twisted about the second central axis in a second twist direction, the second twist direction being opposite the first twist direction,
    each of the first and second helically wound standard single-mode optical fiber cables making contact with one another at multiple locations along their length, due to the first and second helically wound standard single-mode optical fiber cables making contact with one another and being twisted in opposite directions, counteracting forces exist where the first and second helically wound standard single-mode optical fiber cables contact one another to resist an untwisting of the first and second helically wound standard single-mode optical fiber cables.

13. The optic fiber winding according to claim 12, further comprising a central support, each of the first and second helically wound standard single-mode optical fiber cables being arranged around the central support core.

14. The optical fiber-based current measuring assembly according to claim 13, wherein the first helically wound standard single-mode optical fiber cable extends in a helical manner around the central support core according to a first rotation direction, and the second helically wound standard single-mode optical fiber cable extends in a helical manner around the central support core according to a second rotation direction, the first rotation direction being opposite the second rotation direction, such that the first and second helically wound standard single-mode optical fiber cables are interlaced with one another around the central support core.

15. The optical fiber-based current measuring assembly according to claim 14, wherein the first twist direction of the first helically wound standard single-mode optical fiber cable is counterclockwise, the first rotation direction of the first helically wound standard single-mode optical fiber cable is counterclockwise, the second twist direction of the second helically wound standard single-mode optical fiber cable is clockwise, and the second rotation direction of the second helically wound standard single-mode optical fiber cable is clockwise.

16. The optical fiber-based current measuring assembly according to claim 14, wherein the first twist direction of the first helically wound standard single-mode optical fiber cable is clockwise, the first rotation direction of the first helically wound standard single-mode optical fiber cable is counterclockwise, the second twist direction of the second helically wound standard single-mode optical fiber cable is counterclockwise, and the second rotation direction of the second helically wound standard single-mode optical fiber cable is clockwise.

17. The optical fiber-based current measuring assembly according to claim 13, wherein the first helically wound standard single-mode optical fiber cable extends in a helical manner around the central support core according to a first rotation direction, and the second helically wound standard single-mode optical fiber cable extends in a helical manner around the central support core according to a second rotation direction, the first rotation direction being the same as the second rotation direction, and the first and second helically wound standard single-mode optical fiber cables being in contact with one another along their entire longitudinal extension around the central support core.

18. The optical fiber-based current measuring assembly according to claim 17, wherein the first twist direction of the first helically wound standard single-mode optical fiber cable is counterclockwise, the second twist direction of the second helically wound standard single-mode optical fiber cable is clockwise, and the first rotation direction of the first helically wound standard single-mode optical fiber cable and the second rotation direction of the second helically wound standard single-mode optical fiber cable are counterclockwise.

19. The optical fiber-based current measuring assembly according to claim 17, wherein the first twist direction of the first helically wound standard single-mode optical fiber cable is clockwise, the second twist direction of the second helically wound standard single-mode optical fiber cable is counterclockwise, and the first rotation direction of the first helically wound standard single-mode optical fiber cable and the second rotation direction of the second helically wound standard single-mode optical fiber cable are clockwise.

20. The optical fiber-based current measuring assembly according to claim 12, wherein the first helically wound standard single-mode optical fiber cable is twisted about the first central axis in the first twist direction a first number of turns, and the second helically wound standard single-mode optical fiber cable is twisted about the second central axis in the second twist direction a second number of turns, the first and second number of turns being the same.

21. The optical fiber-based current measuring assembly according to claim 20, wherein each of the first and second helically wounds standard single-mode optical fiber cables is twisted $$12 \times 2\pi \frac{\text{rad}}{\text{m}}.$$

* * * * *